United States Patent
Amidi et al.

(10) Patent No.: US 8,379,391 B2
(45) Date of Patent: Feb. 19, 2013

(54) MEMORY MODULE WITH VERTICALLY ACCESSED INTERPOSER ASSEMBLIES

(75) Inventors: Mike H. Amidi, Lake Forest, CA (US); Robert S. Pauley, Mission Viejo, CA (US); Satyanarayan Shivkumar Iyer, Fremont, CA (US)

(73) Assignee: Smart Modular Technologies, Inc., Newark, CA (US)

( * ) Notice: Subject to any disclaimer, the term of this patent is extended or adjusted under 35 U.S.C. 154(b) by 911 days.

(21) Appl. No.: 12/465,560

(22) Filed: May 13, 2009

(65) Prior Publication Data

US 2009/0279243 A1 Nov. 12, 2009

(51) Int. Cl.
*H05K 5/00* (2006.01)
*H05K 7/00* (2006.01)

(52) U.S. Cl. ............. 361/728; 361/679.01; 361/679.31; 361/737; 361/742; 361/805; 361/807; 361/808; 361/810

(58) Field of Classification Search ............. 361/679.01, 361/679.31, 737, 742, 805, 807, 808, 810, 361/728; 257/706–727
See application file for complete search history.

(56) References Cited

U.S. PATENT DOCUMENTS

| 6,233,150 | B1* | 5/2001 | Lin et al. | 361/704 |
| 6,343,020 | B1* | 1/2002 | Lin et al. | 361/816 |
| 6,580,611 | B1* | 6/2003 | Vandentop et al. | 361/704 |
| 6,888,719 | B1* | 5/2005 | Janzen et al. | 361/679.31 |
| 7,023,700 | B2* | 4/2006 | Chiou et al. | 361/704 |
| 2005/0141199 | A1* | 6/2005 | Chiou et al. | 361/704 |
| 2006/0049502 | A1* | 3/2006 | Goodwin et al. | 257/686 |
| 2006/0061975 | A1* | 3/2006 | Chang | 361/759 |
| 2006/0067054 | A1* | 3/2006 | Wang et al. | 361/704 |

* cited by examiner

*Primary Examiner* — Anthony Haughton

(57) ABSTRACT

A memory module with attached transposer and interposers to provide additional surface area for the placement of memory devices is disclosed. The memory module includes a memory board with a first surface, a second surface and an edge with a set of electrical contacts. A transposer is attached to each surface of the memory board, and an interposer is attached to each transposer on the opposite surface of the transposer from the memory board. The interposer has space to allow placement of memory devices on both a first surface between the interposer and the memory board, and on a second surface of the interposer away from the memory board.

19 Claims, 6 Drawing Sheets

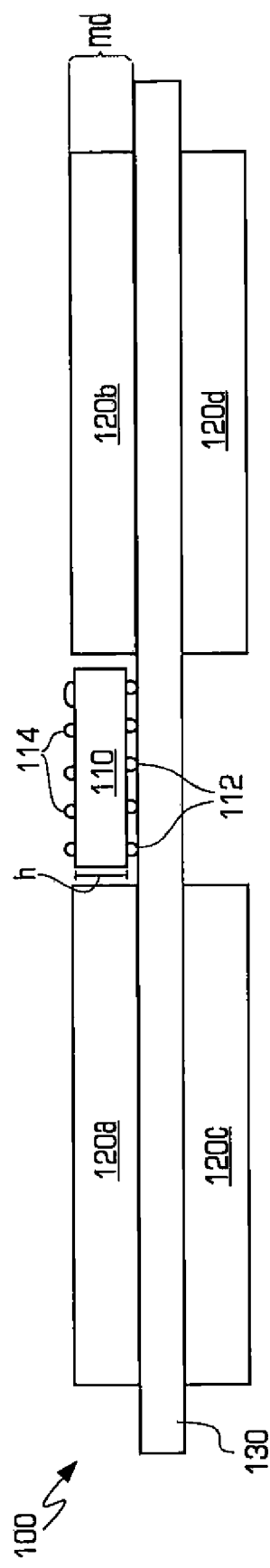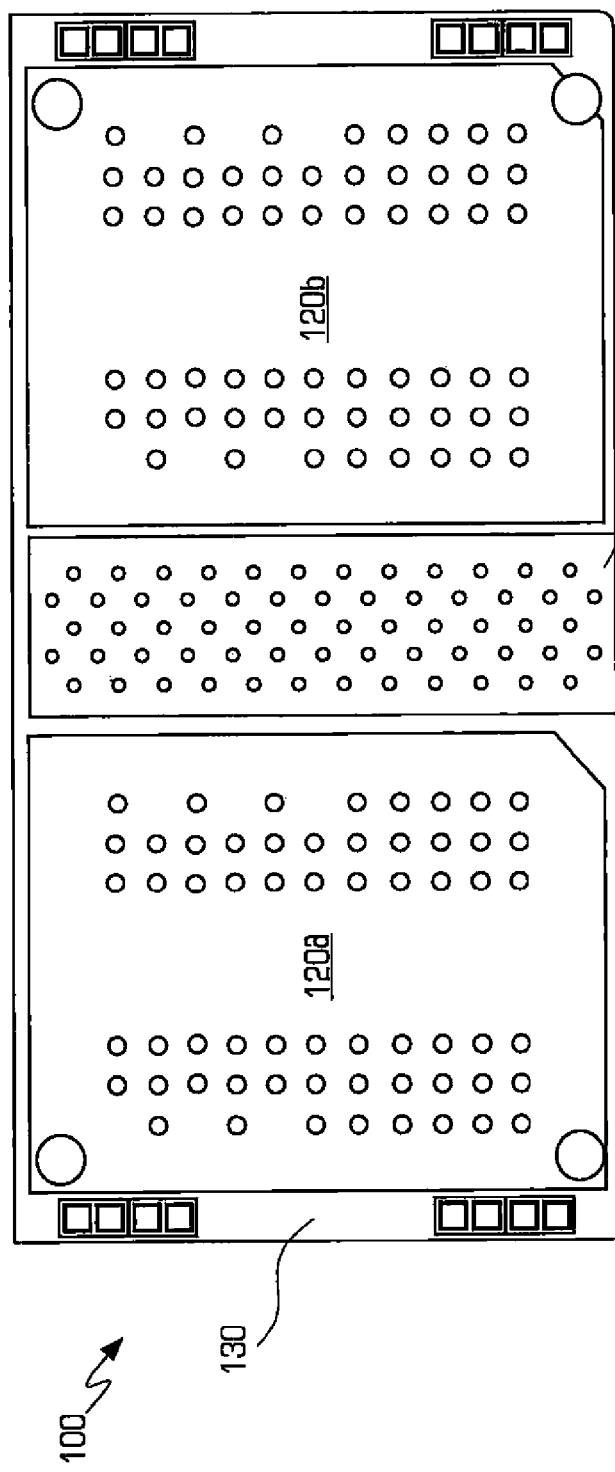

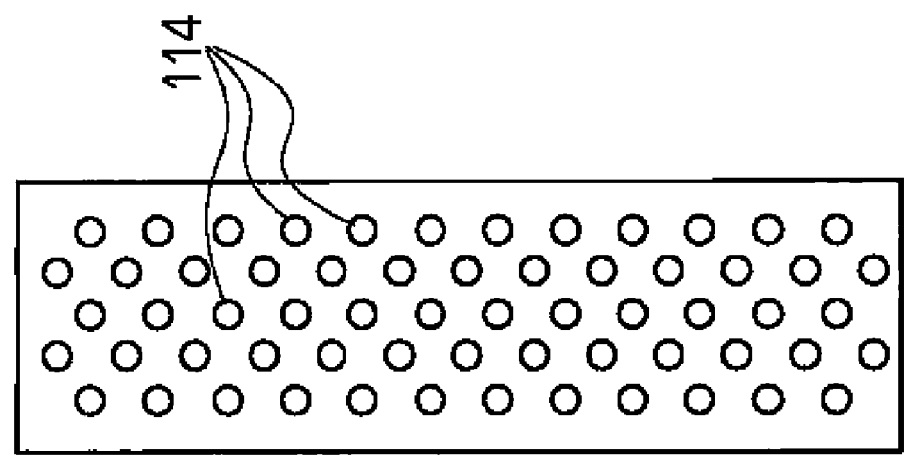

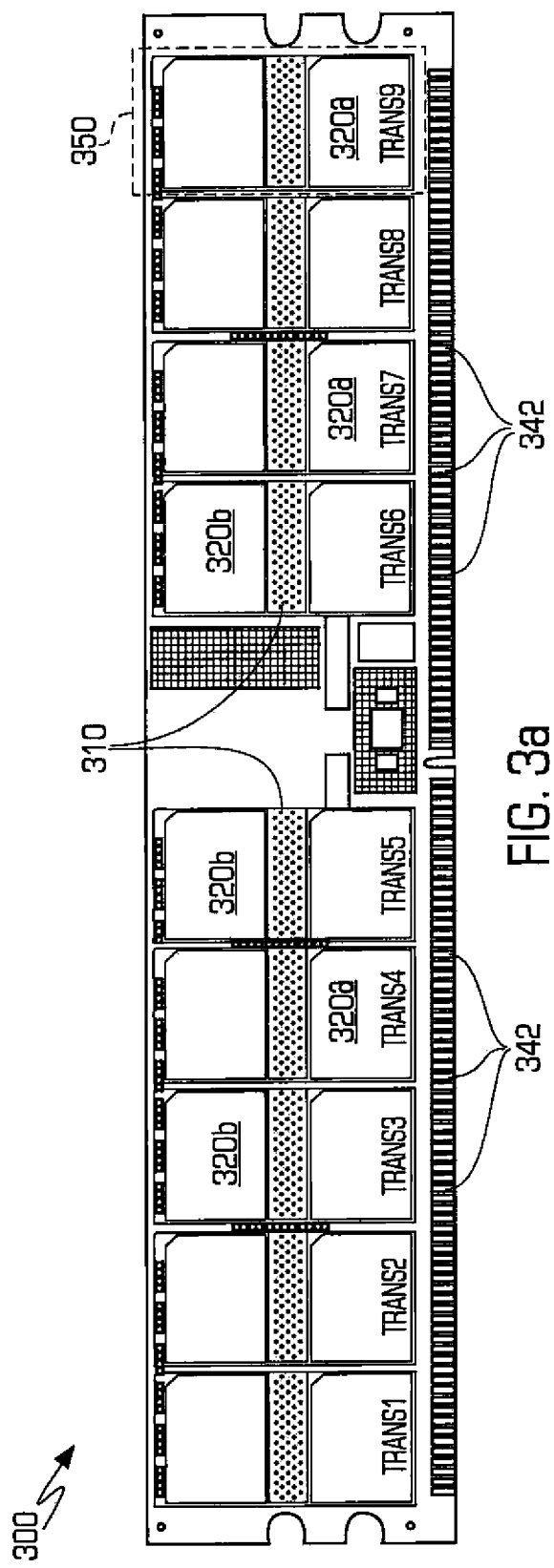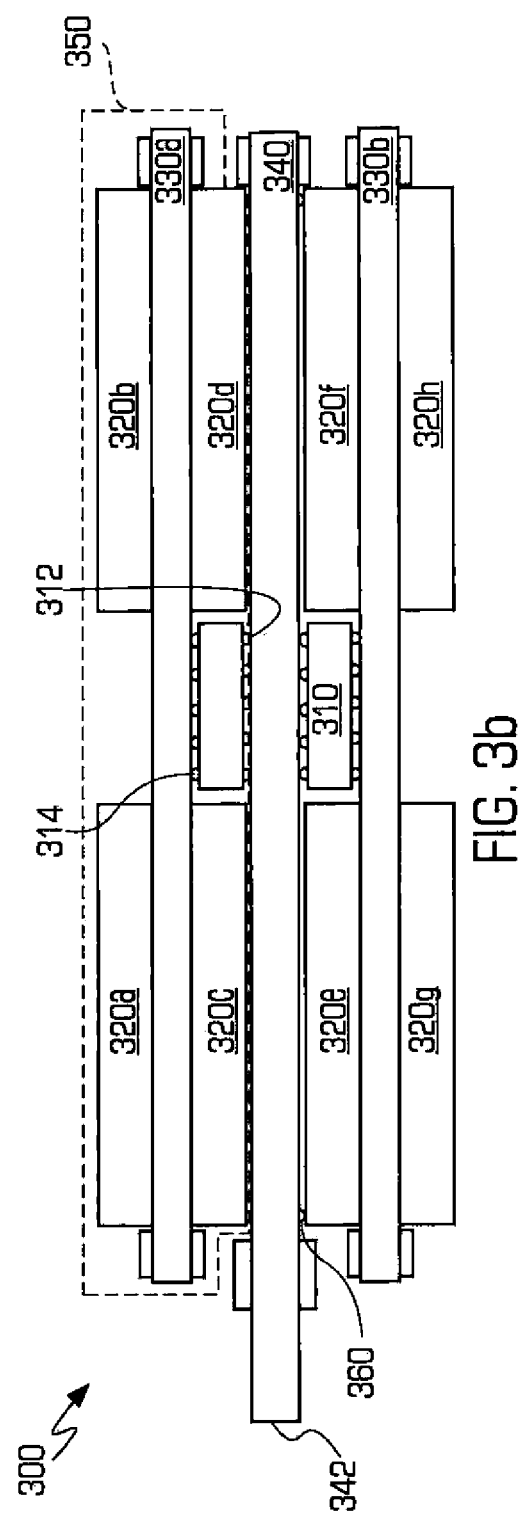

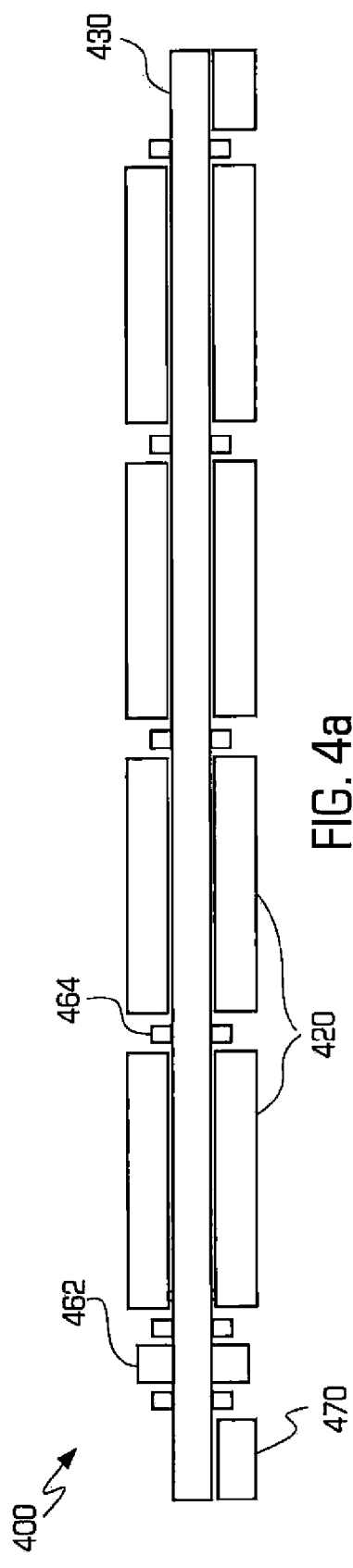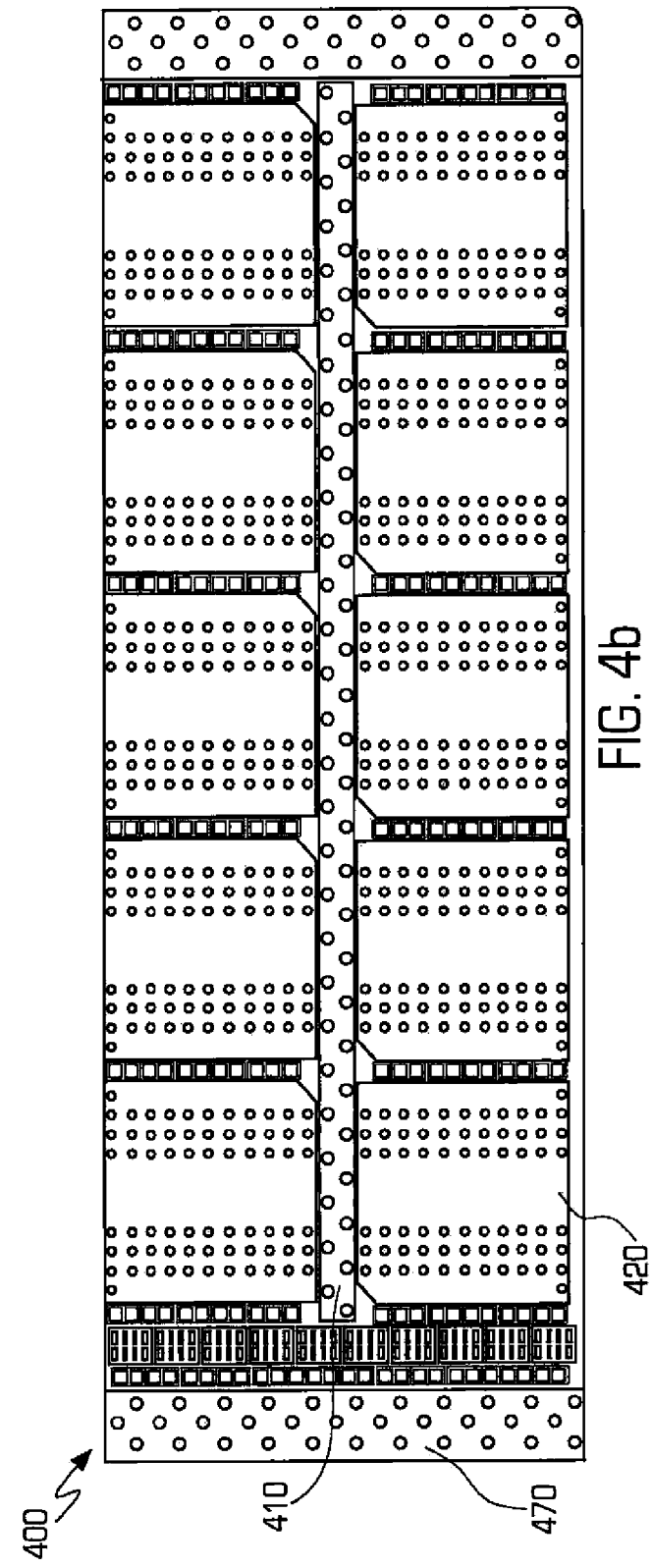

MEMORY MODULE WITH VERTICALLY ACCESSED INTERPOSER ASSEMBLIES

FIELD

The disclosure relates to integrated circuits. Specifically, the invention relates to electronic memory systems and methods with increased surface area for memory chip placement through adding a vertical access to a modular interposer assembly.

BACKGROUND

There is a continual need in the area of electronics and electronic computing systems toward smaller systems and/or systems with greater computing performance for a given space. As systems become smaller and more dense, the area available for integrated circuit mounting and placement also decreases. One approach is to stack circuits and circuit boards vertically, where in the past, electronics have predominately been mounted horizontally on the top and bottom surface of a board. As circuits and boards are stacked vertically in new designs for increased density, the number of electrical connections remains roughly the same or even increases. A number of prior art methods have been used to address the issue of electrical connections in integrated circuits, but these methods have shortcomings including high cost, complexity, physical constraints and other technical issues.

There are various types of integrated circuit devices providing different functionality. One type of integrated circuit device is dynamic random access memory (DRAM), which is common in many electronics systems. A typical DRAM module includes a rectangular board with DRAM chips on both sides of the board and interconnects on a long edge of the board. In this type of module, the memory capacity is constrained by the surface area of the board and the memory density of the DRAM chips.

Due to technological and design considerations, increasing the number of modules, increasing the height or width of the modules, or increasing the memory density of the DRAM chips may not be possible or cost effective. Therefore it would be desirable to provide alternative systems and methods of increasing memory density.

BRIEF DESCRIPTION OF THE DRAWINGS

FIG. 1a is an edge view of an assembly including an interposer board with attached transposer board and memory ICs for use with a vertically integrated memory module.

FIG. 1b is a side view of an assembly including an interposer board with attached transposer board and memory ICs for use with a vertically integrated memory module.

FIG. 2 is a side view of a transposer board for use with a vertically integrated memory module.

FIG. 3a is an edge view of a vertically integrated memory module.

FIG. 3b is a side view of a vertically integrated memory module.

FIG. 4a is an edge view of an assembly including an interposer board with attached transposer board and memory ICs for use with a vertically integrated memory module.

FIG. 4b is a side view of an assembly including an interposer board with attached transposer board and memory ICs for use with a vertically integrated memory module.

DETAILED DESCRIPTION OF ONE OR MORE EMBODIMENTS

Figure 5A:
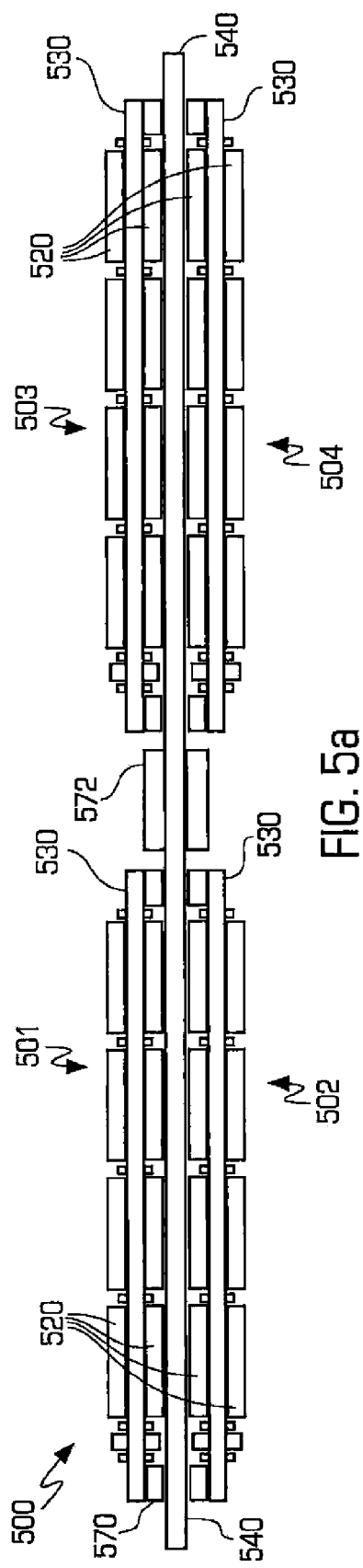
FIG. 5a is an top side view of a vertically integrated memory module.

Reference will now be made in detail to implementations of one or more embodiments of the memory module. The implementations set forth in the following descriptions do not represent all implementations consistent with the innovations herein. Instead, they are merely some examples consistent with some aspects of the innovations. The figures and examples below are not meant as an absolute limit the scope of the memory module. Moreover, where certain elements of the memory module can be partially or fully implemented using known components, only those portions of such known components that are necessary for an understanding of the memory module will be described, and detailed descriptions of other portions of such known components will be omitted so as not to obscure the invention. While the implementations will be primarily described in relation to systems and system components, it should be appreciated that each of the portions or blocks illustrated in the Figures may be implemented in a number of ways.

FIGS. 1a and 1b illustrate a memory assembly 100. Assembly 100 includes one or more memory devices 120 (such as memory devices 120a-120d as shown in FIG. 1a), an interposer 130 and a transposer 110. Electrical interfaces for transposer 110 are shown as interface points 112 and interface points 114 which may be solder bumps or any other possible electrical contact.

Interposer 130 may be a printed circuit board, and has electrical interface points for connecting to memory devices 120 and transposer 110. Transposer 110 may have a height h and one or more memory devices 120 have a height md. In one embodiment, height h is sufficient to prevent memory devices 120a and 120b from impacting or touching any surface above the memory devices. The surface above the memory devices may be a flat planar surface attached to interface points 114. This will typically mean that transposer 110 is thicker or has a height greater than thickness md of memory devices 120.

Interposer 130 contains conductive traces. The traces communicatively and electrically couple memory devices 120 to transposer 110. In one embodiment shown in FIGS. 1a and 1b, the interface points for the transposer 110 and interposer 130 run from roughly one edge of interposer 130 to the other edge, and are placed roughly in between the remaining two edges of rectangular interposer 130, essentially dividing one surface of interposer 130 into two halves as shown in FIG. 1b. The interface points for memory devices 120a and 120b are on opposite sides of transposer 110, each in one half of an interposer 130 surface. Additional memory devices 120c and 120d are situated on a second side of interposer 130 at interface areas corresponding to those of memory devices 120a and 120b on the opposite side of interposer 130.

Memory assembly 100 functions to provide extra surface area for placement of memory devices 120 while also providing electrical connections to the memory devices 120 through transposer 110. Memory devices 120 each contain electrical contacts which are attached to electrical contacts on interposer 130. Interposer 130 contains electrical connections from memory devices 120 to transposer 110, and transposer 110 contains electrical connections from the surface of interposer 130, such as contacts 112, to contacts on an outgoing surface such as contacts 114. Memory assembly 100 thereby nearly doubles the amount of surface area available for placement of memory devices 120.

In one potential embodiment, two memory devices 120 and a transposer 110 on a single side of an interposer 130 will cover most or all of the usable space on one side of transposer 130. In other words, the size of interposer 130 will be as small as feasible while still accommodating two memory devices 120 and transposer 110 on a single side. In one embodiment, interposer 130 may be designed such that the memory devices 120 cover more than 90% of one surface of interposer 130. In alternative embodiments, interposer 130 may be expanded to provide additional memory devices 120 on each side of the interposer 130. In other alternative embodiments the interposer 130 may be larger to provide other arrangements of memory devices 120 which surround or create other patterns relative to transposer 110. Further alternative embodiments may additionally provide for different placement of memory devices 120 which are on the opposite surface of interposer 130 from transposer 110.

Memory devices 120 may be Dynamic Random Access Memory devices (DRAM), but may also be flash memory chips, other types of solid state storage devices, or any other memory device. The memory devices may typically have an array of electrical interfaces with the interposer 130 such as a ball grid array (BGA) with the interfaces spread over an area of interface.

FIG. 2 shows more details of the embodiment of a transposer shown in FIG. 1, transposer 110. Transposer 110 may be a simple PCB with top and bottom surfaces covered with arrays of interface points 114, and simple via or trace connections through transposer 110 from interface points located on opposite sides of transposer 110. Transposer 110 may alternatively contain custom patterns of interface points, as well as additional circuitry, and may be any material suitable for this purpose. Transposer 110 may additionally contain cooling elements to help in distributing or removing heat from more densely packed areas.

FIGS. 3a and 3b show memory module 300 which includes interposers 330, transposers 310, memory devices 320, and memory board 340. Memory board 340 may be a dual in-line memory module (DIMM) board with contacts 342 which may be electrically conductive pins. A subset of contacts 342 will be communicatively coupled to memory devices 320 via electrical paths through memory board 340, transposers 310 and interposer 330. For example, a single contact of contacts 342 may be electrically connected to transposer 310a via an electrical trace to interface point 312. Interface point 312 may be connected by a via or trace to interface point 314, interface point 314 may be connected through an electrical trace on interposer 330a to an electrical connection between memory device 320a and interposer 330a. Similar connections may be available from other of contacts 242 to memory devices 320 a-h, or potentially from the same contact of contacts 242 through a switch contained within memory module 300.

In one potential embodiment, memory board 340 may be designed to conform to the physical interface specifications of a memory standard, such as the memory standards of JEDEC Solid State Technology Association. For example, the number of contacts 342 and dimensions of memory board 340 may be set to conform to a standard such as JESD 205 design specification for 240 pin DDR2 memory DIMMs.

In an additionally potential embodiment, memory module 300 may include physical buffers 360 which may prevent vibration, bending of transposer 330, or unintended contact between memory devices 320 and memory board 340.

Also, memory board 340 may contain an area filled with copper that is proximate to or touching memory modules 320. Typically this copper filled area would be adjacent to the lower inside memory devices 320, which are the devices nearest to contacts 342, such as memory devices 320c and 320e in FIG. 3b, since these devices are positioned to have the least amount of natural heat dissipation when memory module 300 is attached to a system by contacts 342. Such a copper filled heat dissipation area may be used near any memory device close to memory board 340.

FIG. 3a shows a side view of memory module 300. The embodiment of the invention shown in FIG. 3a includes nine memory assemblies per side including memory assembly 350. Memory assembly 350 may be similar to memory assembly 100 shown in FIGS. 1a and 1b. Memory module 300 may also include nine memory assemblies on the opposite side for a total of 18 memory assemblies. Each memory assembly may include four memory devices such as memory devices 320a and 320b visible in FIG. 3a, for a total of 72 memory devices 320.

As mentioned above, alternative embodiments may have differing numbers of memory assemblies on each side of memory module 300. Additionally, alternative embodiments of memory assemblies 320 may allow for more than four memory devices per memory assembly 320.

FIGS. 4a and 4b show a memory assembly 400, which may also be referred to as a personality card. Memory assembly 400 includes transposer 430, interposer 410 and memory devices 420. Memory assembly 400 is similar to memory assembly 100 shown in FIGS. 1a and 1b, but instead of having an interposer with four memory devices and a single interposer, memory assembly 400 includes ten memory devices per side for a total of twenty memory devices on a single interposer. Memory assembly 400 also shows a single transposer 410. In alternate embodiments of the innovations herein, memory assembly 400 may include multiple transposers to carry memory signals from the memory devices 420 to the interposer 430.

Transposer 430 may include resistors 462 for AC termination of signal lines and capacitors 464 for decoupling of power lines. Transposer 430 may also include risers 470 which may provide power and ground connections for memory assembly 400. Risers 470 may also provide structural support to memory assembly 400 that may not be needed for a smaller assembly such as assembly 100 of FIG. 1a.

Figure 5B:
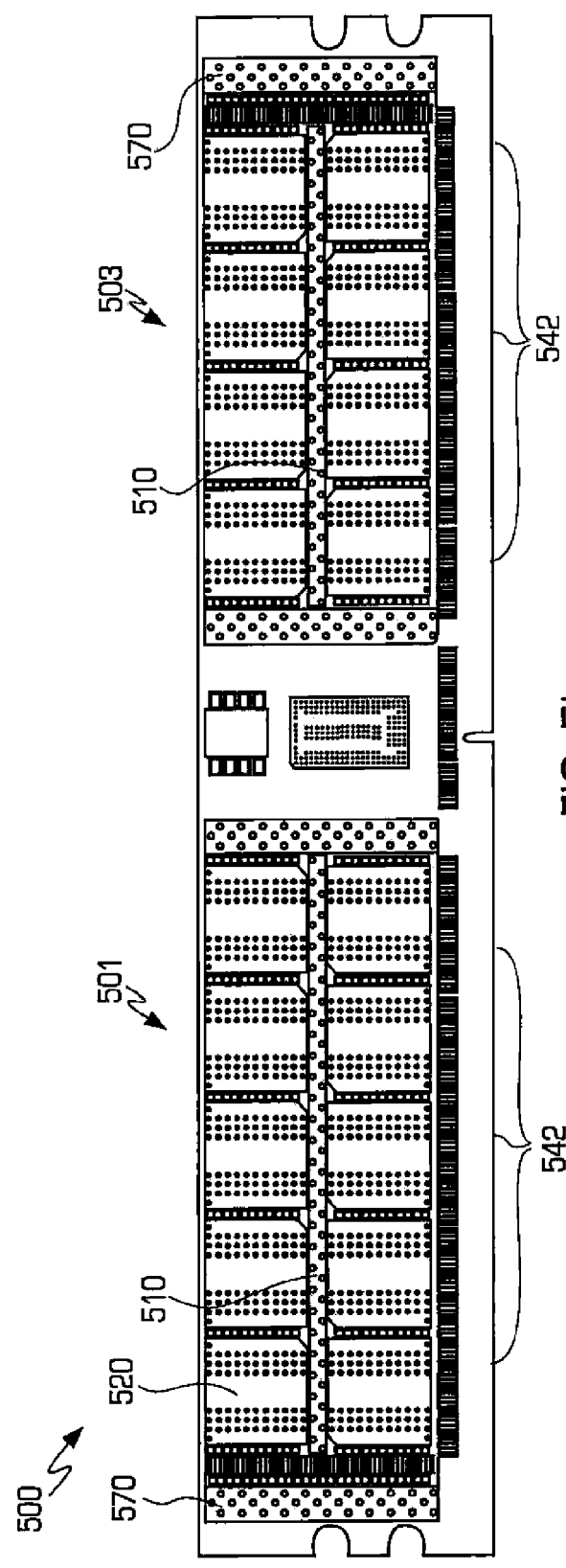
FIG. 5b is a side view of a vertically integrated memory module.

FIGS. 5a and 5b show memory module 500. Memory module 500 includes four memory assemblies or personality cards similar to those described in FIGS. 4a and 4b. Memory assemblies 501 and 502, shown on the upper and lower left hand side of memory board 540, each contain twenty memory modules 520. Memory assemblies 503 and 504, shown on the upper and lower right hand side of memory board 540, each contain sixteen memory modules 520. Therefore, memory module 500 would contain 72 memory devices 520.

Memory module 500 includes transposers 510 which separate interposers 530 from memory board 540. Transposers 510 additionally contain paths for conveying signals as shown by transposer 110 of FIG. 2. Memory module 500 may also include risers 570 with each interposer 530 in each of the assemblies 501-504. The risers 570 may provide physical support for interposers 530, and may provide electrical power and ground, or other signals, to each assembly of assemblies 501-504.

Memory board 540 includes electrical contacts 542 which allow memory module 500 to interface with a larger computing system, and may be designed to conform to various memory standards.

Memory module 500 may include register 572 which may provide and enable an interface to memory devices 520. Module 500 may include a single register 572 or multiple registers in different configurations, such as a register on each surface of memory board 540.

Figure 6:
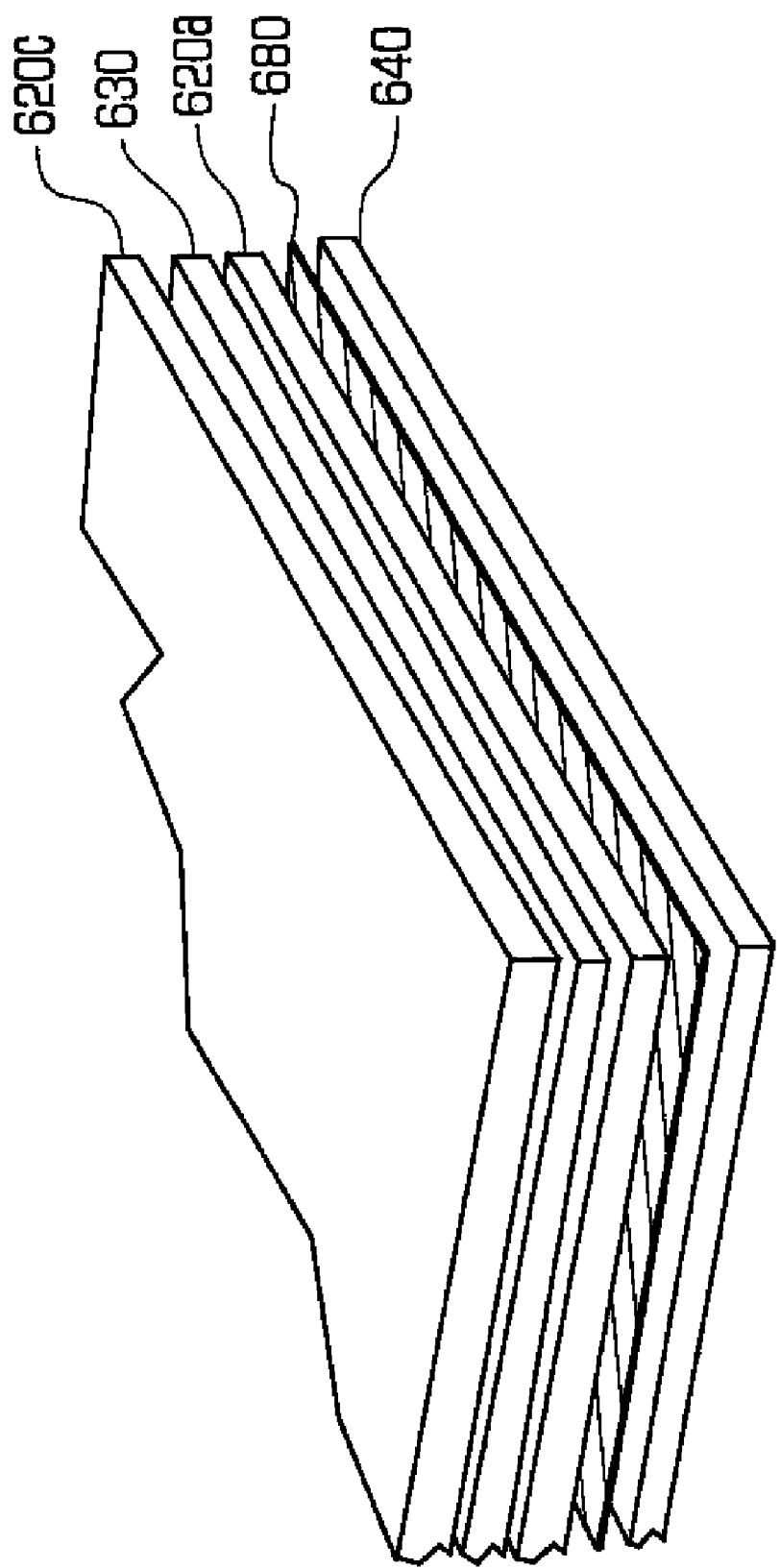
FIG. 6 is a cut out view showing layers of components in a portion of a vertically integrated memory module including a heat dissipation layer.

FIG. 6 shows a cut away slice of a portion of a memory module such as memory module 500 of FIGS. 5a and 5b. The layers shown in FIG. 6 include memory device 620c, interposer 630, memory device 620a, heat dissipation layer 690, and memory board 640. As disclosed above, interposer 630 may be connected to memory board 640 by a transposer (not shown in FIG. 6). Interposer 630 may have memory devices 620 attached to each side, with memory device 620a between interposer 630 and memory board 640. Because of a lack of air flow around memory device 620a due to it being situated so closely between interposer 630 and memory board 640, heat dissipation layer 680 may be included to remove heat from memory device 620a. Heat dissipation layer 680 may be a copper layer formed in memory board 640, or simply attached to surfaces of both memory device 620a and memory board 640. Various patterns of heat dissipation layer 680 may be deployed, or additional devices may be attached to heat dissipation layer 680 to aid in removal of thermal energy from memory devices 620.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween).

It is to be understood that the systems above are not limited to the embodiment(s) described above and illustrated herein, but encompasses any and all variations falling within the scope of the appended claims. For example, references to the memory module herein are not intended to limit the scope of any claim or claim term, but instead merely make reference to one or more features that may be covered by one or more of the claims. Materials, processes and numerical examples described above are exemplary only, and should not be deemed to limit the claims.

What is claimed is:

1. A memory module comprising:
    a memory board with a first side, a second side and an edge, the edge having a set of electrical contacts;
    a first transposer with a first surface and a second surface opposite the first surface;
    a first interposer having a first surface and a second surface opposite the first surface;
    a first memory device and a second memory device wherein the first surface of the first transposer is attached to the first surface of the memory board, the second surface of the first transposer is attached to the first surface of the first interposer, and the first memory device and the second memory device are attached to the first surface of the first interposer;
    a second transposer with a first surface and a second surface opposite the first surface;
    a second interposer having a first surface and a second surface opposite the first surface;
    a third memory device and a fourth memory device;
    a fifth memory device attached to the second surface of the first interposer and a sixth memory device attached to the second surface of the second interposer; and wherein:
    the first surface of the second transposer is attached to the second surface of the memory board, the second surface of the second transposer is attached to the first surface of the second interposer, and the third memory device and the fourth memory device are attached to the first surface of the second interposer;
    the first memory device is connected to a first contact of the set of electrical contacts via a first path along the memory board, the first transposer and the first interposer;
    the second memory device is connected to a second contact of the set of electrical contacts via a second path along the memory board, the first transposer and the first interposer;
    the third memory device is connected to a third contact of the set of electrical contacts via a third path along the memory board, the second transposer and second interposer; and
    the fourth memory device is connected to a fourth contact of the set of electrical contacts via a fourth path along the memory board, the second transposer and second interposer.

2. The memory module of claim 1, wherein the first transposer is between the first and the second memory devices and the second transposer is between the third and fourth memory devices.

3. The memory module of claim 2 further comprising a buffer material between the first memory device and the first surface of the memory board.

4. The memory module of claim 2, wherein the memory board is a six layer printed circuit board with physical dimensions consistent with JEDEC standards for a DDR2 20 memory module.

5. The memory module of claim 2, wherein the first contact and the third contact are the same.

6. The memory module of claim 2, wherein the first and second memory devices and the transposer cover more than 90% of the first surface of the first interposer.

7. The memory module of claim 4 further comprising a seventh memory device attached to the second surface of the first interposer and an eighth memory device attached to the second surface of the second interposer.

8. The memory module of claim 7, wherein the fifth memory device covers a surface area of the second surface of the first interposer directly opposite a surface area of the first surface of the first interposer covered by the first memory device.

9. The memory module of claim 8, wherein each memory device is a dynamic random access memory chip.

10. The memory module of claim 8, wherein each memory device is a flash memory chip.

11. The memory module of claim 1, wherein the first surface of the memory board includes a heat dissipation layer which is proximate to or touching the first memory device and is configured to remove heat from the first memory device.

12. The memory module of claim 11, wherein the heat dissipation layer comprises a copper layer.

13. The memory module of claim 1 further comprising one or more registers which enable access to the first, second, third and fourth memory modules.

14. The memory module of claim 1, wherein the first surface and the second surface of the first transposer each contain an array of electrical contacts arranged in rows and columns.

15. A memory assembly for use with a DIMM comprising:
- an interposer having a first surface and a second surface opposite the first surface;
- a first memory device and a second memory device attached to the first surface of the interposer;
- a third memory device and a fourth memory device attached to the second surface of the interposer; and
- a transposer with a first surface and a second surface opposite the first surface, wherein the first surface of the transposer is attached to the first surface of the interposer; and
- a set of contact points on the second surface of the transposer;
- wherein each of the first, second, third and fourth memory devices are electrically connected to one or more of the set of contact points on the second surface of the transposer by an electrical connection through the interposer and the transposer.

16. The memory assembly of claim 15 wherein the first and second memory devices are electrically connected to identical one or more contact points of the set of contact points.

17. The memory assembly of claim 15 wherein the first and second memory devices are electrically connected to different contact points of the set of contact points.

18. The memory assembly of claim 15, wherein the transposer is between the first memory device and the second memory device.

19. The memory assembly of claim 16, wherein the first memory device covers a surface area of the first surface of the interposer corresponding to a surface area of the second surface of the interposer covered by the third memory device wherein and the second memory device covers a surface area of the first surface of the interposer corresponding to a surface area of the second surface of the interposer covered by the fourth memory device.

* * * * *